(12) United States Patent
Jang et al.

(10) Patent No.: US 11,894,057 B2
(45) Date of Patent: Feb. 6, 2024

(54) MEMORY DEVICE PERFORMING PROGRAM OPERATION AND METHOD OF OPERATING THE SAME

(71) Applicant: SK hynix Inc., Icheon-si (KR)

(72) Inventors: Jung Shik Jang, Icheon-si (KR); Dong Hun Lee, Icheon-si (KR); Yun Sik Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/373,423

(22) Filed: Jul. 12, 2021

(65) Prior Publication Data

US 2022/0238161 A1   Jul. 28, 2022

(30) Foreign Application Priority Data

Jan. 25, 2021  (KR) .................. 10-2021-0010361

(51) Int. Cl.
| | |
|---|---|
| *G11C 16/04* | (2006.01) |
| *G11C 16/10* | (2006.01) |
| *G11C 16/34* | (2006.01) |
| *G11C 16/24* | (2006.01) |
| *G11C 11/56* | (2006.01) |

(52) U.S. Cl.
CPC .......... *G11C 16/10* (2013.01); *G11C 16/0483* (2013.01); *G11C 16/24* (2013.01); *G11C 16/3459* (2013.01); *G11C 11/56* (2013.01)

(58) Field of Classification Search
CPC ..... G11C 16/10; G11C 16/0483; G11C 16/24; G11C 16/3459; G11C 11/56

USPC ..................................................... 365/185.18
See application file for complete search history.

(56) References Cited

U.S. PATENT DOCUMENTS

| | | | | |
|---|---|---|---|---|
| 8,503,232 | B2 * | 8/2013 | Yang | G11C 11/5628 |
| | | | | 365/185.25 |
| 9,679,638 | B2 * | 6/2017 | Lee | G11C 16/12 |
| 10,049,748 | B2 * | 8/2018 | Hong | G11C 16/3481 |
| 10,726,932 | B2 * | 7/2020 | Lee | G11C 16/349 |
| 11,361,834 | B1 * | 6/2022 | Kumar | G11C 16/26 |
| 2015/0146485 | A1 * | 5/2015 | Kim | G11C 16/3454 |
| | | | | 365/185.03 |
| 2016/0172041 | A1 * | 6/2016 | Sakui | G11C 11/5628 |
| | | | | 365/185.12 |
| 2016/0293259 | A1 * | 10/2016 | Kim | G11C 11/5628 |
| 2019/0122736 | A1 * | 4/2019 | Chun | G11C 16/32 |

FOREIGN PATENT DOCUMENTS

| | | |
|---|---|---|
| KR | 1020140144990 A | 12/2014 |
| KR | 1020170011324 A | 2/2017 |
| KR | 1020190122061 A | 10/2019 |

* cited by examiner

*Primary Examiner* — Tha-O H Bui
(74) *Attorney, Agent, or Firm* — William Park & Associates Ltd.

(57) ABSTRACT

A memory device includes a plurality of memory cells, a peripheral circuit, and control logic. The peripheral circuit is configured to perform an incremental step pulse program (ISPP) on the plurality of memory cells. The control logic is configured to control the peripheral circuit to perform the ISPP using bit line voltages set based on different bit line step voltages according to a target program state of each of the plurality of memory cells among a plurality of program states.

20 Claims, 16 Drawing Sheets

FIG. 11

| PL # | 1 | 2 | 3 | 4 | 5 | 6 | 7 | 8 | 9 | 10 | 11 | 12 | 13 | PGM Step Voltage | Remark # of PL firstly reaching the target Vth | Remark # of PL lastly reaching the target Vth |
|---|---|---|---|---|---|---|---|---|---|---|---|---|---|---|---|---|
| WL | VWL | VWL+ΔVWL | VWL+2ΔVWL | VWL+3ΔVWL | VWL+4ΔVWL | VWL+5ΔVWL | VWL+6ΔVWL | VWL+7ΔVWL | VWL+8ΔVWL | VWL+9ΔVWL | VWL+10ΔVWL | VWL+11ΔVWL | VWL+12ΔVWL | | | |
| BL P1 Cell | Vgnd | Vgnd | Vgnd | Vgnd | Vinh | Vinh | Vinh | Vinh | Vinh | Vinh | Vinh | Vinh | Vinh | Vps | 1 | 4 |
| BL P2 Cell | Vgnd | Vgnd | Vgnd | Vgnd | Vgnd | Vinh | Vinh | Vinh | Vinh | Vinh | Vinh | Vinh | Vinh | Vps | 2 | 5 |
| BL P3 Cell | Vgnd | Vgnd | Vgnd | Vgnd | Vgnd | Vgnd | Vinh | Vinh | Vinh | Vinh | Vinh | Vinh | Vinh | Vps | 3 | 6 |
| BL P4 Cell | Vgnd | Vgnd | Vgnd | Vgnd | Vgnd | Vgnd | Vgnd | Vgnd | Vinh | Vinh | Vinh | Vinh | Vinh | Vps | 5 | 8 |
| BL P5 Cell | Vgnd | Vgnd | Vgnd | Vgnd | Vgnd | Vgnd | Vgnd | Vgnd | Vgnd | Vinh | Vinh | Vinh | Vinh | Vps | 7 | 9 |
| BL P6 Cell | Vgnd | Vgnd | Vgnd | Vgnd | Vgnd | Vgnd | Vgnd | Vgnd | Vgnd | Vgnd | Vinh | Vinh | Vinh | Vps | 8 | 11 |
| BL P7 Cell | Vgnd | Vgnd | Vgnd | Vgnd | Vgnd | Vgnd | Vgnd | Vgnd | Vgnd | Vgnd | Vgnd | Vgnd | Vgnd | Vps | 10 | 13 |
| BL Inhibit | Vinh | Vinh | Vinh | Vinh | Vinh | Vinh | Vinh | Vinh | Vinh | Vinh | Vinh | Vinh | Vinh | - | - | - |

Vps = ΔVWL − ΔVBL

| PL # | 1 | 2 | 3 | 4 | 5 | 6 | 7 | 8 | PGM Step Voltage | Remark | |
|---|---|---|---|---|---|---|---|---|---|---|---|
| WL | VWL | VWL +ΔVWL_a | VWL +2ΔVWL_a | VWL +3ΔVWL_a | VWL +4ΔVWL_a | VWL +5ΔVWL_a | VWL +6ΔVWL_a | VWL +7ΔVWL_a | | # of PL firstly reaching the target Vth | # of PL lastly reaching the target Vth |
| BL P1 Cell | VBL1_a | VBL1_a +ΔVBL1_a | VBL1_a +2ΔVBL1_a | VBL1_a +3ΔVBL1_a | VBL1_a +4ΔVBL1_a | VBL1_a +5ΔVBL1_a | VBL1_a +6ΔVBL1_a | VBL1_a +7ΔVBL1_a | Vps1_a | 1 | 8 |
| BL P2 Cell | VBL2_a | VBL2_a +ΔVBL2_a | VBL2_a +2ΔVBL2_a | VBL2_a +3ΔVBL2_a | VBL2_a +4ΔVBL2_a | VBL2_a +5ΔVBL2_a | VBL2_a +6ΔVBL2_a | VBL2_a +7ΔVBL2_a | Vps2_a | 3 | 8 |
| BL P3 Cell | VBL3_a | VBL3_a +ΔVBL3_a | VBL3_a +2ΔVBL3_a | VBL3_a +3ΔVBL3_a | VBL3_a +4ΔVBL3_a | VBL3_a +5ΔVBL3_a | VBL3_a +6ΔVBL3_a | VBL3_a +7ΔVBL3_a | Vps3_a | 4 | 8 |
| BL P4 Cell | VBL4_a | VBL4_a +ΔVBL4_a | VBL4_a +2ΔVBL4_a | VBL4_a +3ΔVBL4_a | VBL4_a +4ΔVBL4_a | VBL4_a +5ΔVBL4_a | VBL4_a +6ΔVBL4_a | VBL4_a +7ΔVBL4_a | Vps4_a | 5 | 8 |
| BL P5 Cell | VBL5_a | VBL5_a +ΔVBL5_a | VBL5_a +2ΔVBL5_a | VBL5_a +3ΔVBL5_a | VBL5_a +4ΔVBL5_a | VBL5_a +5ΔVBL5_a | VBL5_a +6ΔVBL5_a | VBL5_a +7ΔVBL5_a | Vps5_a | 6 | 8 |
| BL P6 Cell | VBL6_a | VBL6_a +ΔVBL6_a | VBL6_a +2ΔVBL6_a | VBL6_a +3ΔVBL6_a | VBL6_a +4ΔVBL6_a | VBL6_a +5ΔVBL6_a | VBL6_a +6ΔVBL6_a | VBL6_a +7ΔVBL6_a | Vps6_a | 6 | 8 |
| BL P7 Cell | Vgnd | Vgnd | Vgnd | Vgnd | Vgnd | Vgnd | Vgnd | Vgnd | Vps7_a | 6 | 8 |
| BL Inhibit | Vinh_a | Vinh_a | Vinh_a | Vinh_a | Vinh_a | Vinh_a | Vinh_a | Vinh_a | - | - | - |

$Vps = \Delta VWL - \Delta VBL$
$Vps1\_a = \Delta VWL\_a - \Delta VBL1\_a$
$Vps2\_a = \Delta VWL\_a - \Delta VBL2\_a$
......
$Vps6\_a = \Delta VWL\_a - \Delta VBL6\_a$
$Vps7\_a = \Delta VWL\_a$

FIG. 15

| PL # | 1 | 2 | 3 | 4 | 5 | 6 | 7 | 8 | 9 | Remark | | |
|---|---|---|---|---|---|---|---|---|---|---|---|---|
| WL | VWL | VWL +$\Delta$VWL_b | VWL +2$\Delta$VWL_b | VWL +3$\Delta$VWL_b | VWL +4$\Delta$VWL_b | VWL +5$\Delta$VWL_b | VWL +6$\Delta$VWL_b | VWL +7$\Delta$VWL_b | VWL +8$\Delta$VWL_b | PGM Step Voltage | # of PL firstly reaching the target Vth | # of PL lastly reaching the target Vth |
| P1 Cell BL VBL1_b | VBL1_b | VBL1_b +$\Delta$VBL1_b | VBL1_b +2$\Delta$VBL1_b | VBL1_b +3$\Delta$VBL1_b | VBL1_b +4$\Delta$VBL1_b | VBL1_b +5$\Delta$VBL1_b | Vinh_b | Vinh_b | Vinh_b | Vps1_b | 1 | 6 |
| P2 Cell VBL2_b | VBL2_b | VBL2_b +$\Delta$VBL2_b | VBL2_b +2$\Delta$VBL2_b | VBL2_b +3$\Delta$VBL2_b | VBL2_b +4$\Delta$VBL2_b | VBL2_b +5$\Delta$VBL2_b | VBL2_b +6$\Delta$VBL2_b | Vinh_b | Vinh_b | Vps2_b | 3 | 7 |
| P3 Cell VBL3_b | VBL3_b | VBL3_b +$\Delta$VBL3_b | VBL3_b +2$\Delta$VBL3_b | VBL3_b +3$\Delta$VBL3_b | VBL3_b +4$\Delta$VBL3_b | VBL3_b +5$\Delta$VBL3_b | VBL3_b +6$\Delta$VBL3_b | VBL3_b +7$\Delta$VBL3_b | Vinh_b | Vps3_b | 4 | 8 |
| P4 Cell VBL4_b | VBL4_b | VBL4_b +$\Delta$VBL4_b | VBL4_b +2$\Delta$VBL4_b | VBL4_b +3$\Delta$VBL4_b | VBL4_b +4$\Delta$VBL4_b | VBL4_b +5$\Delta$VBL4_b | VBL4_b +6$\Delta$VBL4_b | VBL4_b +7$\Delta$VBL4_b | VBL4_b +8$\Delta$VBL4_b | Vps4_b | 5 | 9 |
| P5 Cell VBL5_b | VBL5_b | VBL5_b +$\Delta$VBL5_b | VBL5_b +2$\Delta$VBL5_b | VBL5_b +3$\Delta$VBL5_b | VBL5_b +4$\Delta$VBL5_b | VBL5_b +5$\Delta$VBL5_b | VBL5_b +6$\Delta$VBL5_b | VBL5_b +7$\Delta$VBL5_b | VBL5_b +8$\Delta$VBL5_b | Vps5_b | 6 | 9 |
| P6 Cell VBL6_b | VBL6_b | VBL6_b +$\Delta$VBL6_b | VBL6_b +2$\Delta$VBL6_b | VBL6_b +3$\Delta$VBL6_b | VBL6_b +4$\Delta$VBL6_b | VBL6_b +5$\Delta$VBL6_b | VBL6_b +6$\Delta$VBL6_b | VBL6_b +7$\Delta$VBL6_b | VBL6_b +8$\Delta$VBL6_b | Vps6_b | 7 | 9 |
| P7 Cell Vgnd | Vgnd | Vgnd | Vgnd | Vgnd | Vgnd | Vgnd | Vgnd | Vgnd | Vgnd | Vps7_b | 7 | 9 |
| Inhibit Vinh_b | Vinh_b | Vinh_b | Vinh_b | Vinh_b | Vinh_b | Vinh_b | Vinh_b | Vinh_b | Vinh_b | - | - | - |

Vps = $\Delta$VWL - $\Delta$VBL
Vps1_b = $\Delta$VWL_b - $\Delta$VBL1_b
Vps2_b = $\Delta$VWL_b - $\Delta$VBL2_b
⋮
Vps6_b = $\Delta$VWL_b - $\Delta$VBL6_b
Vps7_b = $\Delta$VWL_b

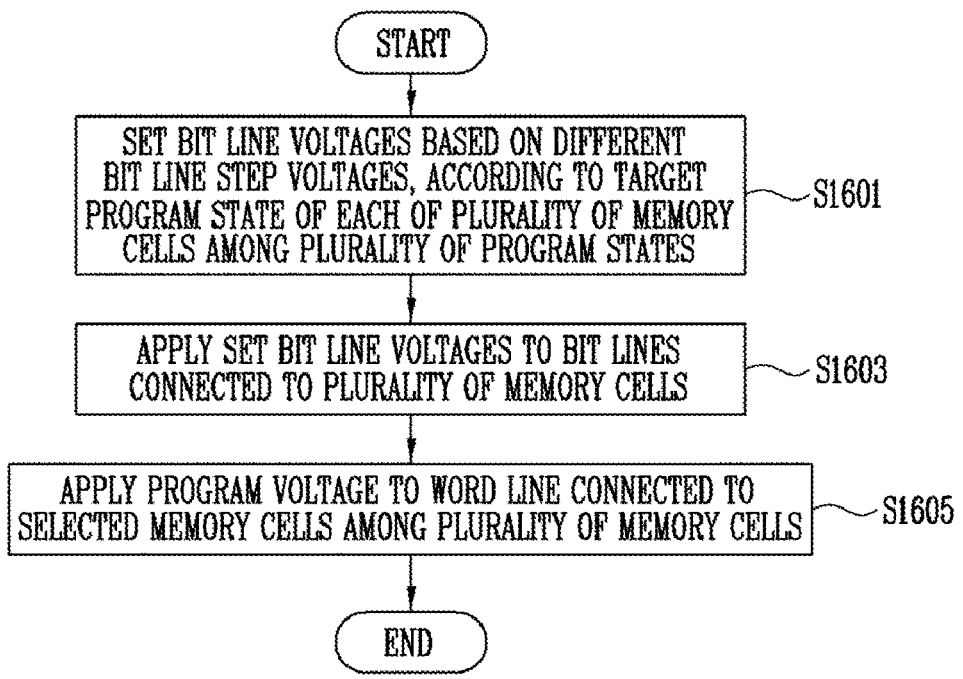

MEMORY DEVICE PERFORMING PROGRAM OPERATION AND METHOD OF OPERATING THE SAME

CROSS-REFERENCE TO RELATED APPLICATION

The present application claims priority under 35 U.S.C. § 119(a) to Korean patent application number 10-2021-0010361, filed on Jan. 25, 2021, in the Korean Intellectual Property Office, the entire disclosure of which is incorporated herein by reference.

BACKGROUND

1. Technical Field

The present disclosure relates to an electronic device, and more particularly, to a memory device and a method of operating the same.

2. Related Art

A storage device is a device that stores data under the control of a host device such as a computer or a smartphone. A storage device may include a memory device in which data is stored and a memory controller controlling the memory device. The memory device may be a volatile memory device or a nonvolatile memory device.

A volatile memory device is a device that stores data only when power is supplied and loses the stored data when the power supply is cut off. A volatile memory device may include static random access memory (SRAM), dynamic random access memory (DRAM), and the like.

A nonvolatile memory device is a device that does not lose data even though power is cut off. A nonvolatile memory device may include read only memory (ROM), programmable ROM (PROM), electrically programmable ROM (EPROM), electrically erasable and programmable ROM (EEPROM), flash memory, and the like.

SUMMARY

An embodiment of the present disclosure is directed to a memory device with an improved program operation speed and a method of operating the same.

According to an embodiment of the present disclosure, a memory device includes a plurality of memory cells, a peripheral circuit, and control logic. The peripheral circuit is capable of performing, and in an embodiment is configured to perform, an incremental step pulse program (ISPP) on the plurality of memory cells. The control logic is capable of controlling, and in an embodiment is configured to control, the peripheral circuit to perform the ISPP using bit line voltages set based on different bit line step voltages according to a target program state of each of the plurality of memory cells among a plurality of program states.

According to an embodiment of the present disclosure, a method of operating a memory device that performs an incremental step pulse program (ISPP) on a plurality of memory cells includes setting bit line voltages based on different bit line step voltages, according to a target program state of each of the plurality of memory cells among a plurality of program states, applying the set bit line voltages to bit lines connected to the plurality of memory cells, and applying a program voltage to a word line connected to selected memory cells among the plurality of memory cells.

According to the presented technology, a memory device with an improved program operation speed and a method of operating the same are disclosed.

BRIEF DESCRIPTION OF THE DRAWINGS

FIG. 11 is a diagram illustrating program setting values related to the program operation of FIG. 10.

FIG. 13 is a diagram illustrating program setting values related to the program operation of FIG. 12.

FIG. 15 is a diagram illustrating program setting values related to the program operation of FIG. 14.

FIG. 16 is a flowchart illustrating a program operation of a memory device according to an embodiment.

DETAILED DESCRIPTION

Specific structural or functional descriptions of embodiments according to the concept of the present disclosure which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Figure 1:
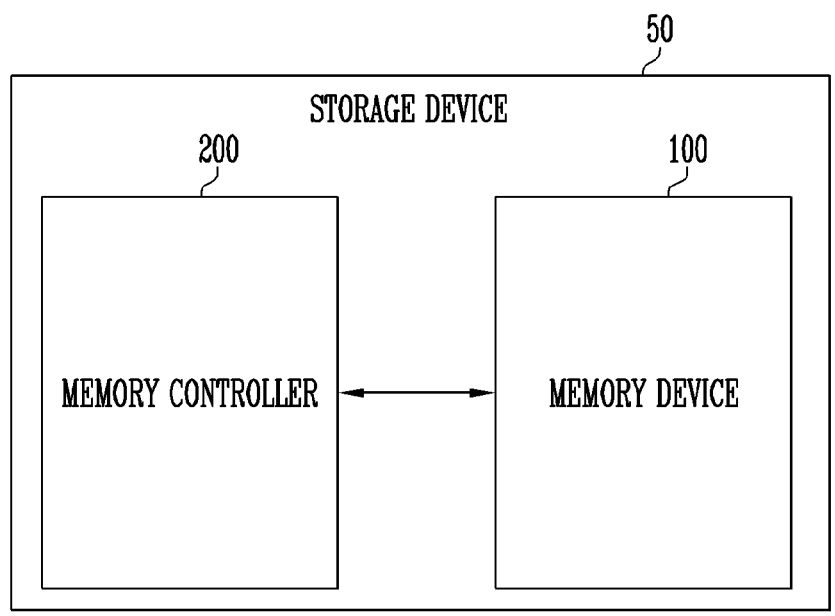
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 is a device that stores data under control of a host such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multichip package (MCP), a chip on board (COB), a wafer-level fabricated package (WFP), and a wafer-level stack package (WSP).

The memory device 100 may store data. The memory device 100 operates under the control of the memory controller 200. The memory device 100 may include a memory cell array including a plurality of memory cells that store the data.

Each of the memory cells may be configured as a single-level cell (SLC) storing one data bit, a multi-level cell (MLC) storing two data bits, a triple-level cell (TLC) storing three data bits, or a quad-level cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may include double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 includes NAND flash memory.

The memory device 100 is configured to receive a command and an address from the memory controller 200 and access an area selected by the address in the memory cell array. That is, the memory device 100 may perform an operation instructed by the command on the area selected by the address. For example, the memory device 100 may perform a write operation (program operation), a read operation, or an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls an overall operation of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host and the memory device 100.

In an embodiment, the memory controller 200 may receive data and a logical block address (LBA) from the host and convert the LBA into a physical block address (PBA) indicating an address of memory cells in which data included in the memory device 100 is to be stored.

The memory controller 200 may control the memory device 100 to perform the program operation, the read operation, or the erase operation in response to a request from the host. During the program operation, the memory controller 200 may provide a write command, the PBA, and the data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate and transmit the command, the address, and the data to the memory device 100 regardless of the request from the host. For example, the memory controller 200 may provide the command, the address, and the data to the memory device 100 so as to perform background operations such as a program operation for wear leveling and a program operation for garbage collection.

In an embodiment, the memory controller 200 may control at least two memory devices 100. In this case, the memory controller 200 may control the memory devices 100 according to an interleaving method so as to improve operation performance. The interleaving method may be an operation method for overlapping operation periods of at least two memory devices 100.

The host may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
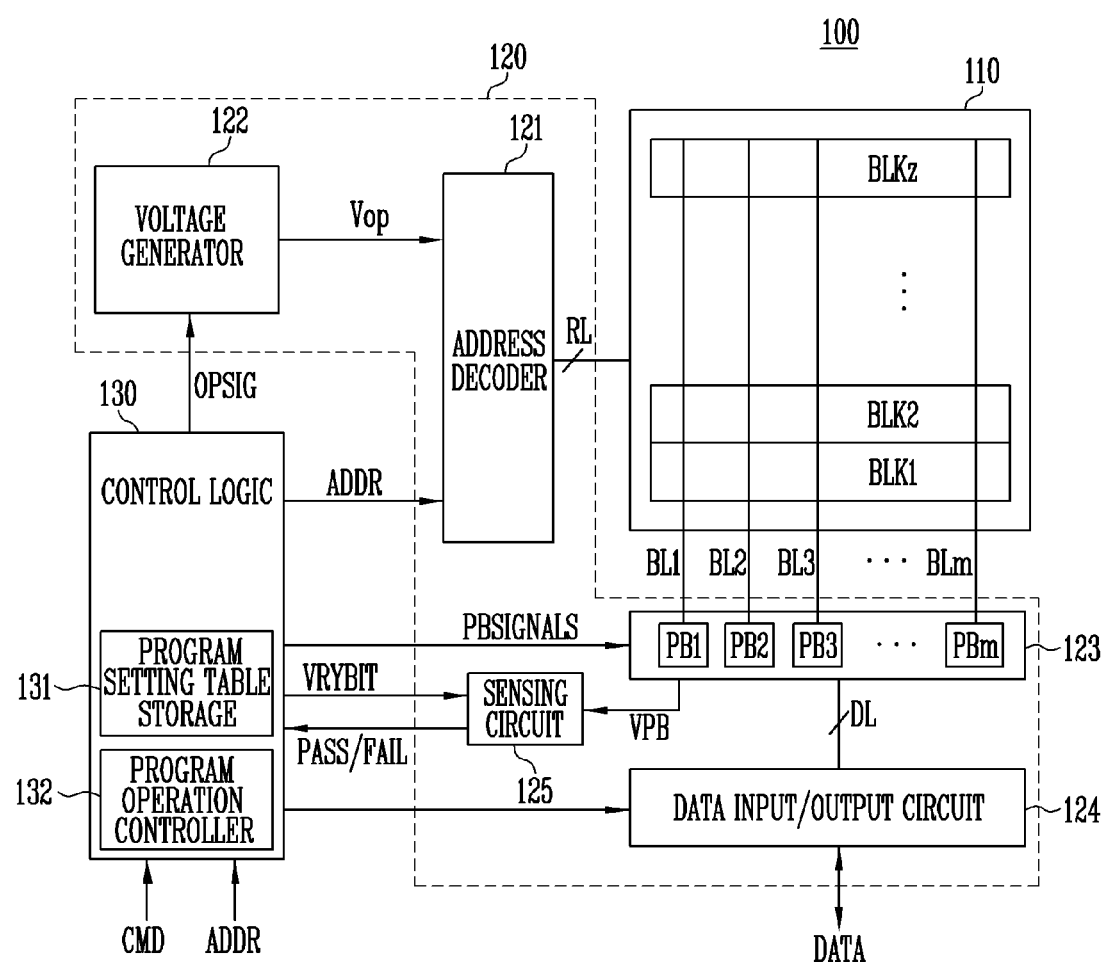
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes the plurality of memory cells. As an embodiment, the plurality of memory cells are nonvolatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as an SLC that stores one data bit, an MLC that stores two data bits, a TLC that stores three data bits, or a QLC that stores four data bits.

The peripheral circuit 120 may include the address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line among word lines of the selected memory block according to the decoded row address. The address decoder 121 may apply an operation voltage Vop supplied from the voltage generator 122 to the selected word line.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The address decoder 121 may decode the block address and select at least one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of programing, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL1 to BLm and store the read data DATA in the first to m-th page buffers PB1 to PBm.

During the erase operation, the read and write circuit 123 may float the bit lines BL1 to BLm. As an embodiment, the read and write circuit 123 may include a column selection circuit.

The data input/output circuit 124 is connected to the first to m-th page buffers PB1 to PBm through the data lines DL.

The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs normal data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device. The control logic 130 may be implemented as hardware, software, or a combination of hardware and software. For example, the control logic 130 may be a control logic circuit operating in accordance with an algorithm and/or a processor executing control logic code.

The control logic 130 may generate various signals in response to the command CMD and the address ADDR to control the peripheral circuit 120. For example, the control logic 130 may generate an operation signal OPSIG, the address ADDR, a read and write circuit control signal PBSIGNALS, and the permission bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the permission bit VRYBIT to the sensing circuit 125. In addition, the control logic 130 may determine whether the verify operation has passed or failed in response to the pass or fail signal PASS/FAIL output by the sensing circuit 125.

In an embodiment, the peripheral circuit 120 may perform an incremental step pulse program (ISPP) on the plurality of memory cells.

The control logic 130 may set bit line voltages based on different bit line step voltages according to a target program state of each of the plurality of memory cells among a plurality of program states. The control logic 130 may control the peripheral circuit 120 to perform the ISPP using the bit line voltages set based on the different bit line step voltages.

In an embodiment, the control logic 130 may include a program setting table storage 131 and a program operation controller 132.

The program setting table storage 131 may store information on the bit line step voltages corresponding to the plurality of respective program states. The program setting table storage 131 may represent a program setting table storage circuit or device. In an embodiment, as the target program state is higher, a magnitude of the bit line step voltage corresponding to the target program state may be set to be lower. As the target program state is higher, the magnitude of the program step voltage corresponding to the target program state may be set to be higher. The magnitude of the program step voltage may be a difference value between a word line step voltage and the bit line step voltage corresponding to the target program state.

The program setting table storage 131 may update information on the bit line step voltages according to a request from the host. The program setting table storage 131 may update the information on the bit line step voltages according to a lifetime of the memory device 100. The lifetime of the memory device 100 may be determined based on erase and write count values of the memory blocks.

The program operation controller 132 may control the peripheral circuit 120 to perform the ISPP based on the information on the bit line step voltages. The program operation controller 132 may control the peripheral circuit 120 to increase the bit line voltages by a corresponding bit line step voltage as a program loop count increases. The program operation controller 132 may complete program operations on at least two or more of the plurality of program states in the same program loop. The program operation controller 132 may complete the program operations on each of the plurality of program states in a last program loop.

Figure 3:
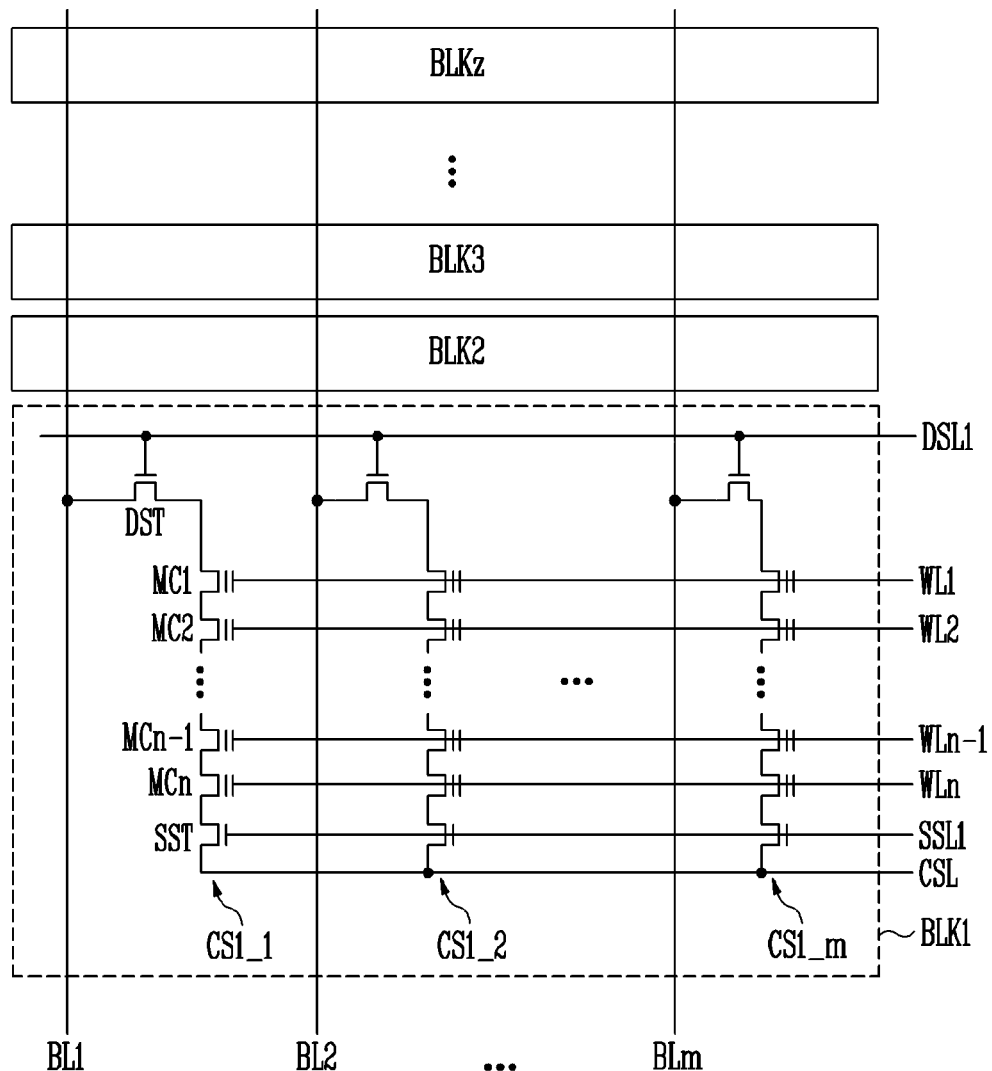
FIG. 3 is a diagram illustrating a memory cell array of FIG. 2.

FIG. 3 is a diagram illustrating the memory cell array 110 of FIG. 2.

Referring to FIG. 3, first to z-th memory blocks BLK1 to BLKz are commonly connected to the first to m-th bit lines BL1 to BLm. In FIG. 3, for convenience of description, elements included in the first memory block BLK1 among the plurality of memory blocks BLK1 to BLKz are shown, and elements included in each of the remaining memory blocks BLK2 to BLKz are omitted. It may be understood that each of the remaining memory blocks BLK2 to BLKz is configured similarly to the first memory block BLK1.

The memory block BLK1 may include a plurality of cell strings CS1_1 to CS1_$m$ ($m$ is a positive integer). The first to m-th cell strings CS1_1 to CS1_$m$ are connected to the first to m-th bit lines BL1 to BLm, respectively. Each of the first to m-th cell strings CS1_1 to CS1_$m$ includes a drain select transistor DST, a plurality of memory cells MC1 to MCn ($n$ is a positive integer) connected in series, and a source select transistor SST.

A gate terminal of the drain select transistor DST included in each of the first to m-th cell strings CS1_1 to CS1_$m$ is connected to a drain select line DSL1. Each of the gate terminals of the first to n-th memory cells MC1 to MCn included in each of the first to m-th cell strings CS1_1 to CS1_$m$ are connected to the first to n-th word lines WL1 to WLn. A gate terminal of the source select transistor SST included in each of the first to m-th cell strings CS1_1 to CS1_$m$ is connected to a source select line SSL1.

For convenience of description, a structure of the cell string is described based on the first cell string CS1_1 among the plurality of cell strings CS1_1 to CS1_$m$. However, it may be understood that each of the remaining cell strings CS1_2 to CS1_$m$ is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected to each other in series. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
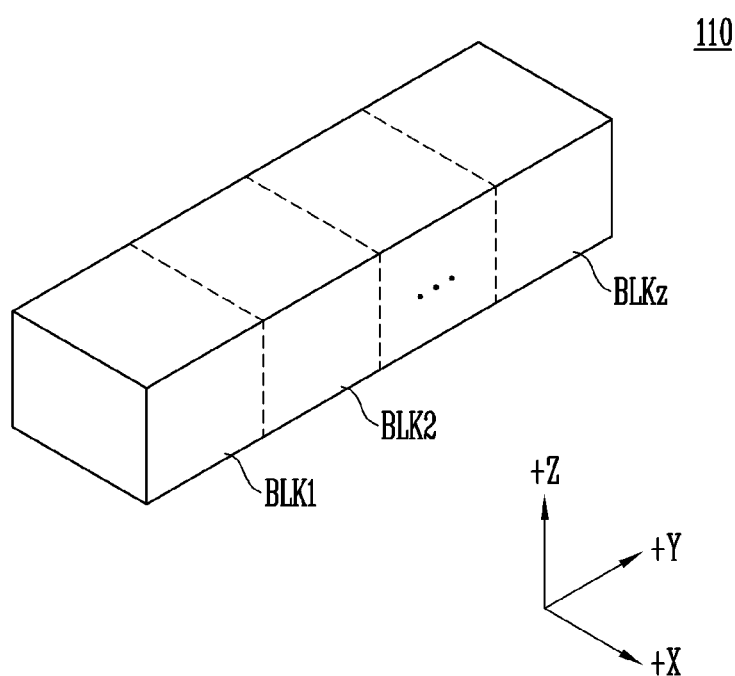
FIG. 4 is a diagram illustrating another embodiment of the memory cell array of FIG. 2.

FIG. 4 is a diagram illustrating another embodiment of the memory cell array 110 of FIG. 2.

Referring to FIG. 4, the memory cell array 110 includes a plurality of memory blocks BLK1 to BLKz. Each memory block has a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 5 and 6.

Figure 5:
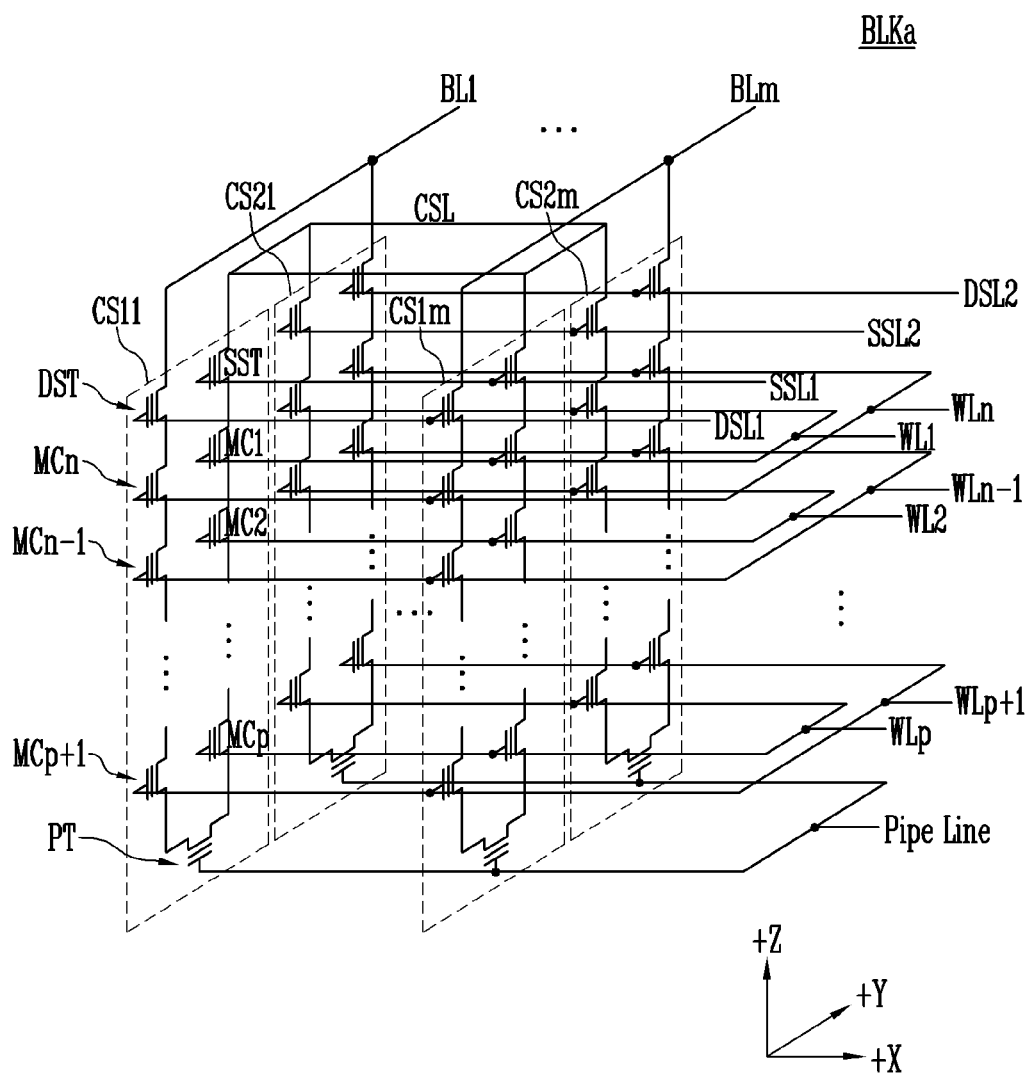
FIG. 5 is a circuit diagram illustrating any one memory block BLKa among memory blocks BLK1 to BLKz of FIG. 4.

FIG. 5 is a circuit diagram illustrating any one memory block BLKa among the memory blocks BLK1 to BLKz of FIG. 4.

Referring to FIG. 5, the memory block BLKa includes a plurality of cell strings CS11 to CS1*m* and CS21 to CS2*m*. As an embodiment, each of the plurality of cell strings CS11 to CS1*m* and CS21 to CS2*m* may be formed in a 'U' shape. In the memory block BLKa, m cell strings are arranged in a row direction (that is, the +X direction). In FIG. 5, two cell strings are arranged in a column direction (that is, the +Y direction). However, this is for convenience of description and it may be understood that three or more cell strings may be arranged in the column direction.

In an embodiment, one memory block may include a plurality of sub blocks. One sub block may include cell strings arranged in a 'U' shape in one column.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 5, the source select transistors of the cell strings CS11 to CS1*m* of a first row are connected to a first source select line SSL1. The source select transistors of the cell strings CS21 to CS2*m* of a second row are connected to a second source select line SSL2.

As another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 5, the cell strings CS11 and CS21 of the first column are connected to the first bit line BL1. The cell strings CS1*m* and CS2*m* of the m-th column are connected to the m-th bit line BLm.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1*m* or CS21 to SC2*m* arranged in the row direction may be connected to even bit lines, and odd-numbered cell strings among the cell strings CS11 to CS1*m* or CS21 to CS2*m* arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 6:
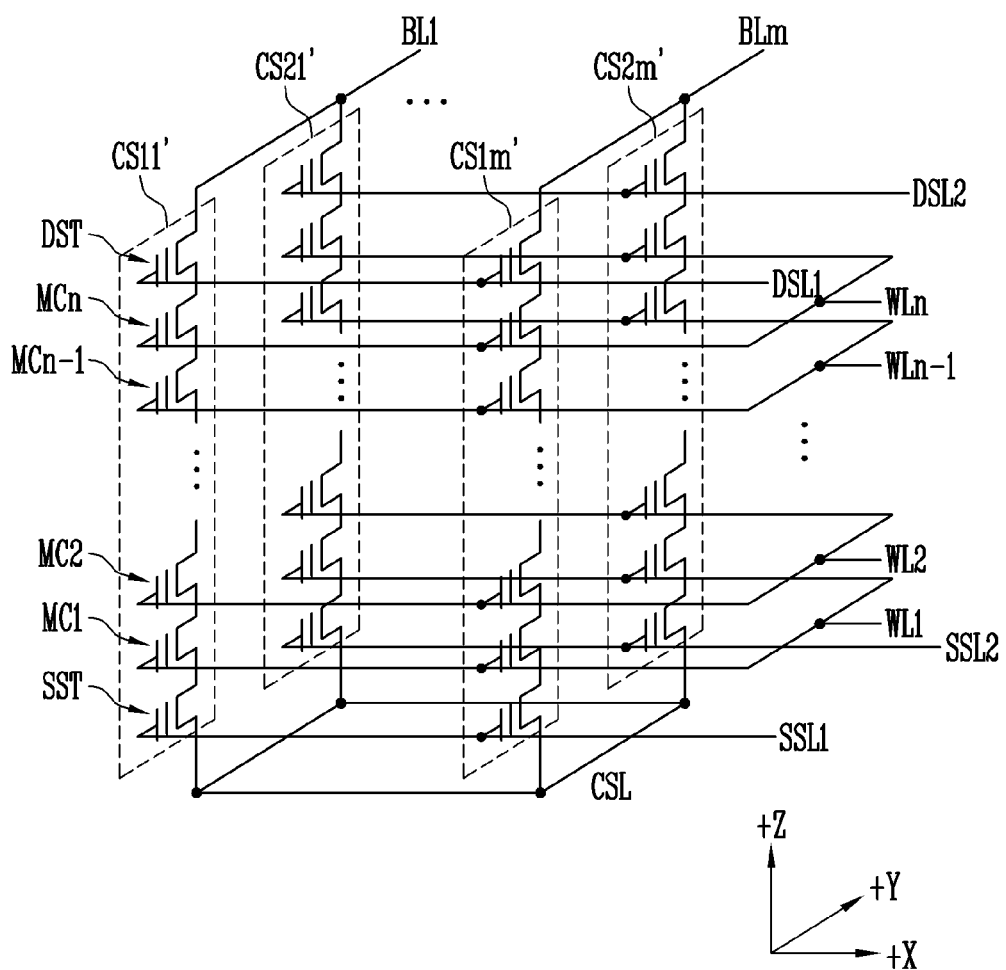
FIG. 6 is a circuit diagram illustrating another embodiment of any one memory block BLKb among the memory blocks BLK1 to BLKz of FIG. 4.

FIG. 6 is a circuit diagram illustrating another embodiment of any one memory block BLKb among the memory blocks BLK1 to BLKz of FIG. 4.

Referring to FIG. 6, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

In an embodiment, one memory block may include a plurality of sub blocks. One sub block may include cell strings arranged in an 'I' shape in one column.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 6 has an equivalent circuit similar to that of the memory block BLKa of FIG. 5 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less dummy memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 7:
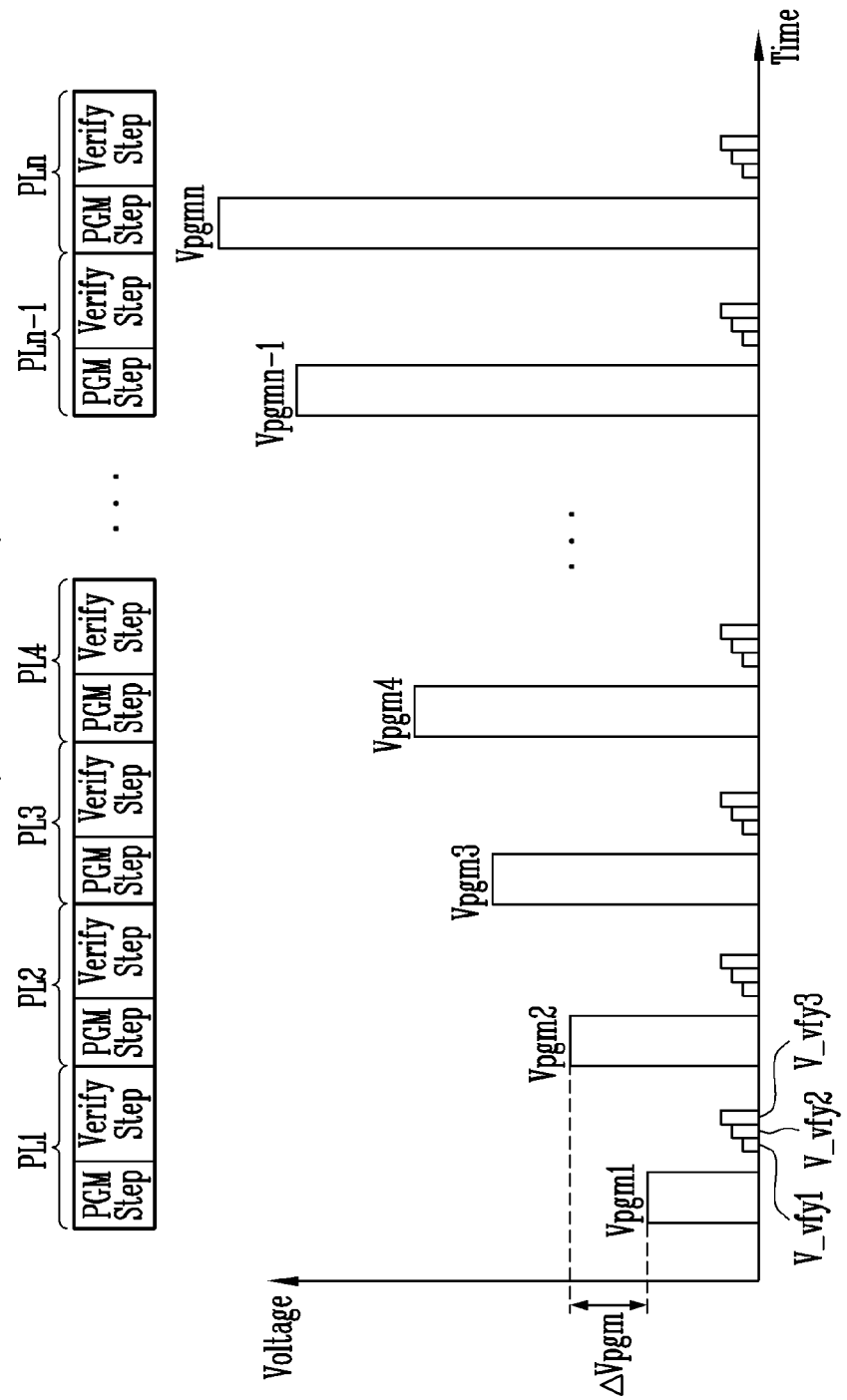
FIG. 7 is a diagram illustrating an incremental step pulse program (ISPP).

FIG. 7 is a diagram illustrating an incremental step pulse program (ISPP).

In FIG. 7, for convenience of description, it is assumed that the memory cell is the MLC storing 2-bit of data. However, the scope of the present disclosure is not limited thereto, and the memory cell may be the TLC storing 3-bit of data or the QLC storing 4-bit of data. The number of data bits stored in the memory cell may be one or more.

The memory device may perform a plurality of program loops PL1 to PLn to program selected memory cells to have a threshold voltage corresponding to any one of a plurality of program states P1, P2, and P3.

Each of the plurality of program loops PL1 to PLn may include a program voltage apply step PGM Step of applying the program voltage to the selected word line connected to the selected memory cells and a program verify step Verify Step of determining whether the memory cells are programmed by applying the verify voltages.

For example, when the first program loop PL1 is performed, first to third verify voltages V_vfy1 to V_vfy3 are sequentially applied to verify the program state of the selected memory cells after a first program voltage Vpgm1 is applied. At this time, verification of the memory cells for which the target program state is the first program state P1 may be performed by the first verify voltage V_vfy1, verification of the memory cells for which the target program state is the second program state P2 may be performed by the second verify voltage V_vfy2, and verification of the memory cells for which the target program state is the third program state P3 may be performed by the third verify voltage V_vfy3.

The memory cells for which the verification has passed by the verify voltages V_vfy1 to V_vfy3 may be determined to have the target program state, and then program of the memory cells for which the verification has passed by the verify voltages V_vfy1 to V_vfy3 may be inhibited in the second program loop PL2. In other words, a program prohibition voltage may be applied to a bit line connected to the memory cell for which the verification is passed from the second program loop PL2.

In the second program loop PL2, a second program voltage Vpgm2 higher than the first program voltage Vpgm1 by a unit voltage ΔVpgm is applied to the selected word line in order to program the remaining memory cells other than the memory cells for which the program is inhibited. Thereafter, the verify operation is performed identically to the verify operation of the first program loop PL1. For example, the verify pass indicates that the memory cell is read as an off-cell by a corresponding verify voltage.

As described above, when the memory device programs the MLC storing 2-bits, the memory device verifies each of the memory cells for which each program state becomes the target program state using the first to third verify voltages V_vfy1 to V_vfy3.

During the verify operation, the verify voltage is applied to the selected word line, which is the word line to which the selected memory cells are connected, and the page buffer of FIG. 2 may determine whether the verification of the memory cells has passed, based on a current flowing through the bit lines respectively connected to the selected memory cells or a voltage applied to the bit line.

In a case of the ISPP, because the program verify operation is performed for each program loop, a threshold voltage distribution of the memory cell may be formed with high accuracy. A time point at which the program inhibition voltage is applied to the bit line connected to the memory cell may be determined based on a result of the program verify operation.

Figure 8:
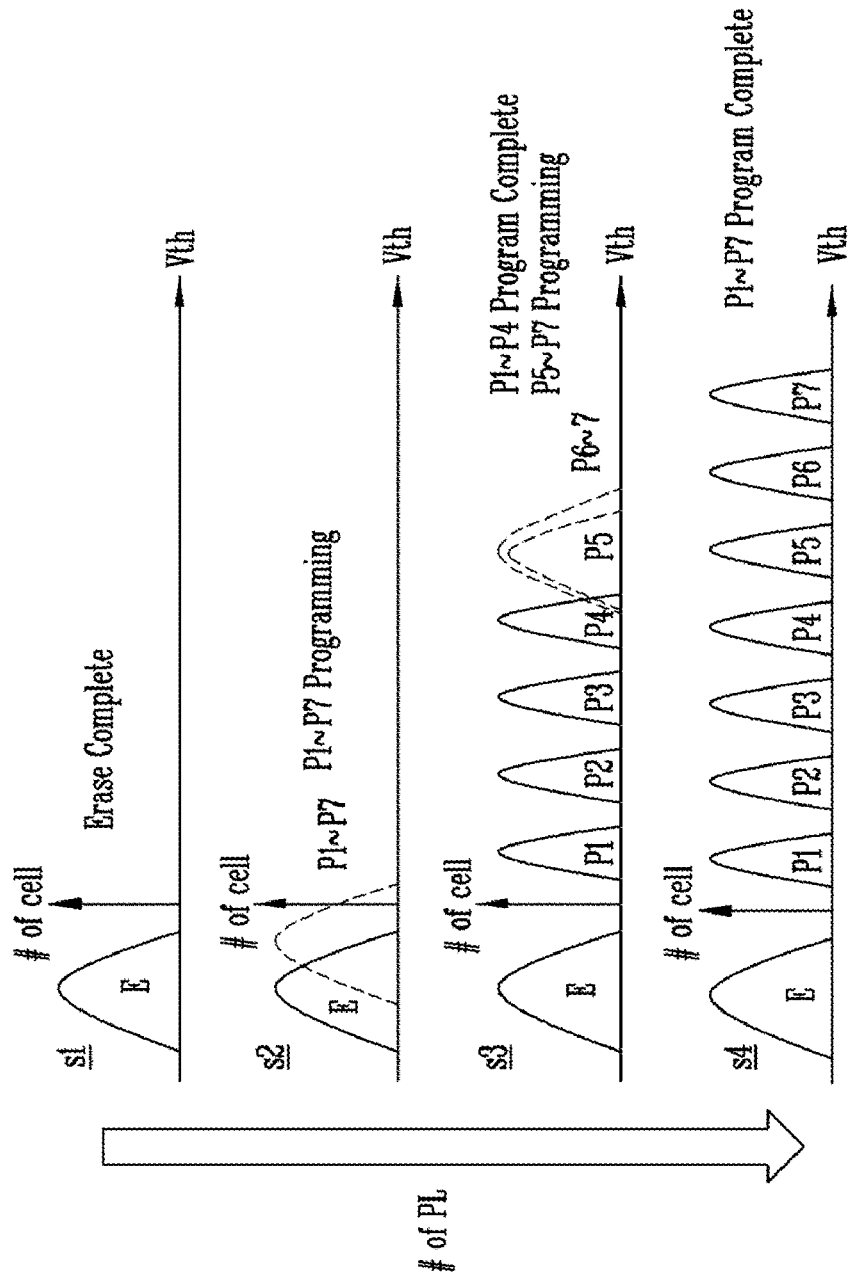
FIG. 8 is a diagram illustrating a threshold voltage distribution of a memory cell as a program loop count increases in an ISPP according to an embodiment.

FIG. 8 is a diagram illustrating a threshold voltage distribution of a memory cell as a program loop count increases in an ISPP according to an embodiment.

Referring to FIG. 8, as the number of program loops performed in the ISPP increases, the threshold voltage distribution of the memory cell may change from s1 to s4. In FIG. 8, the memory cell may be the TLC storing three data bits. The number of data bits stored in the memory cell is not limited to the present embodiment. The memory cell may be programmed to any one of first to seventh program states P1 to P7.

At s1, all memory cells may be in an erase state E.

At s2, memory cells to be programmed to the first to seventh program states P1 to P7 among the memory cells may be being programmed.

At s3, memory cells to be programmed to the first to fourth program states P1 to P4 among the memory cells may be in a program completed state. Memory cells to be programmed to the fifth to seventh program states P5 to P7 among the memory cells may be being programmed.

At s4, all of the memory cells to be programmed to the first to seventh program states P1 to P7 among the memory cells may be in a program completed state.

In FIG. 8, as the program loop count of the ISPP increases, the program operation may be completed in an order from a low program state to a high program state. A time point at which the program operation is completed and program setting values related to the program operation are described later with reference to FIGS. 10 and 11.

Figure 9:
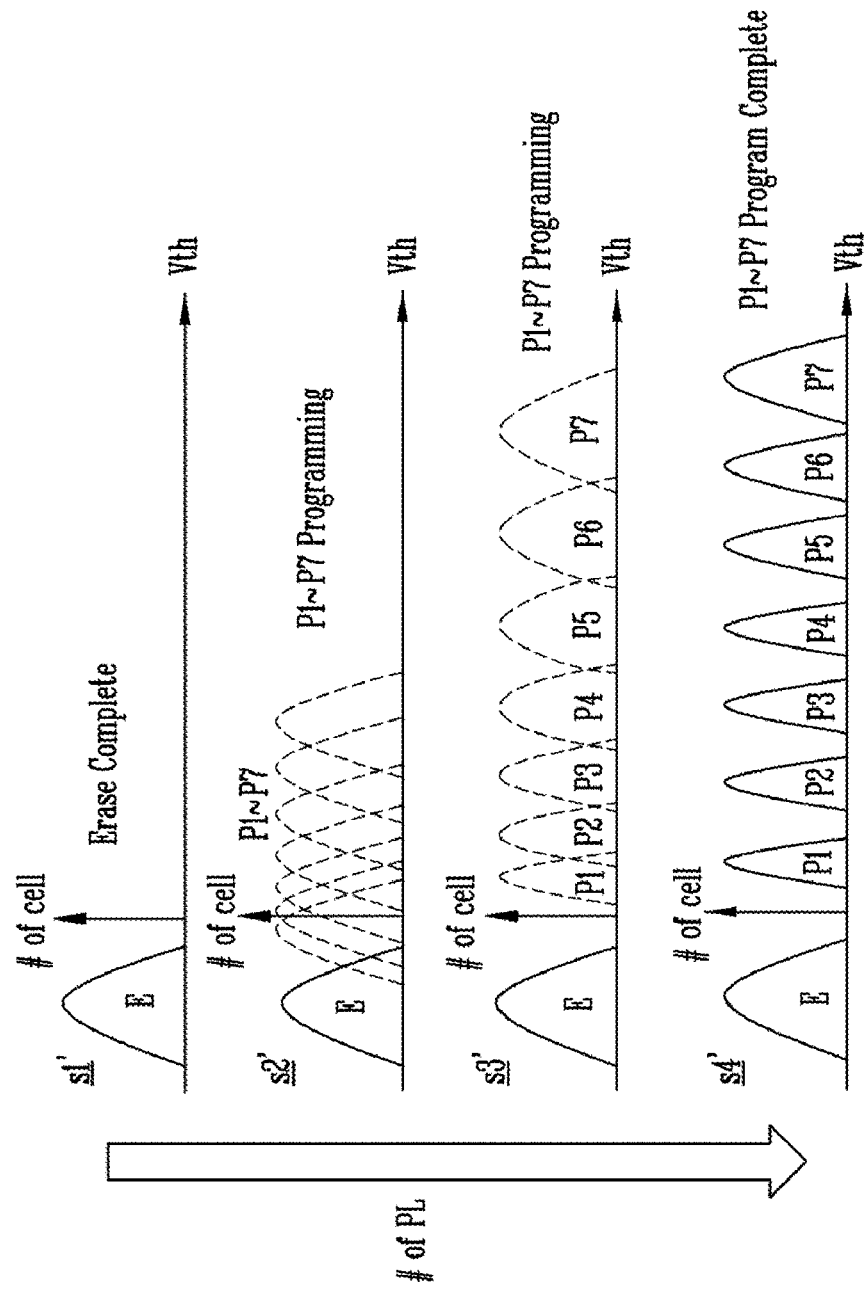
FIG. 9 is a diagram illustrating a threshold voltage distribution of a memory cell as a program loop count increases in an ISPP according to an embodiment.

FIG. 9 is a diagram illustrating a threshold voltage distribution of a memory cell as a program loop count increases in an ISPP according to an embodiment.

Referring to FIG. 9, as the number of program loops performed in the ISPP increases, the threshold voltage distribution of the memory cell may change from s1' to s4'. The memory cell may be programmed to any one of the first to seventh program states P1 to P7.

At s1', all memory cells may be in the erase state E.

In s2' and s3', memory cells to be programmed to the first to seventh program states P1 to P7 among the memory cells may be being programmed.

At s4', all of the memory cells to be programmed to the first to seventh program states P1 to P7 among the memory cells may be in the program completed state.

In FIG. 9, even though the ISPP loop count increases, the program operation of all of the plurality of program states may be completed in the last program loop regardless of the program state. The time point at which the program operation is completed and the program setting values related to the program operation are described later with reference to FIGS. 12 and 13.

In various embodiments, a program operation corresponding to at least two or more of the plurality of program states may be completed in the same program loop. The time point at which the program operation is completed and the program setting values related to the program operation are described later with reference to FIGS. 14 and 15.

Figure 10:
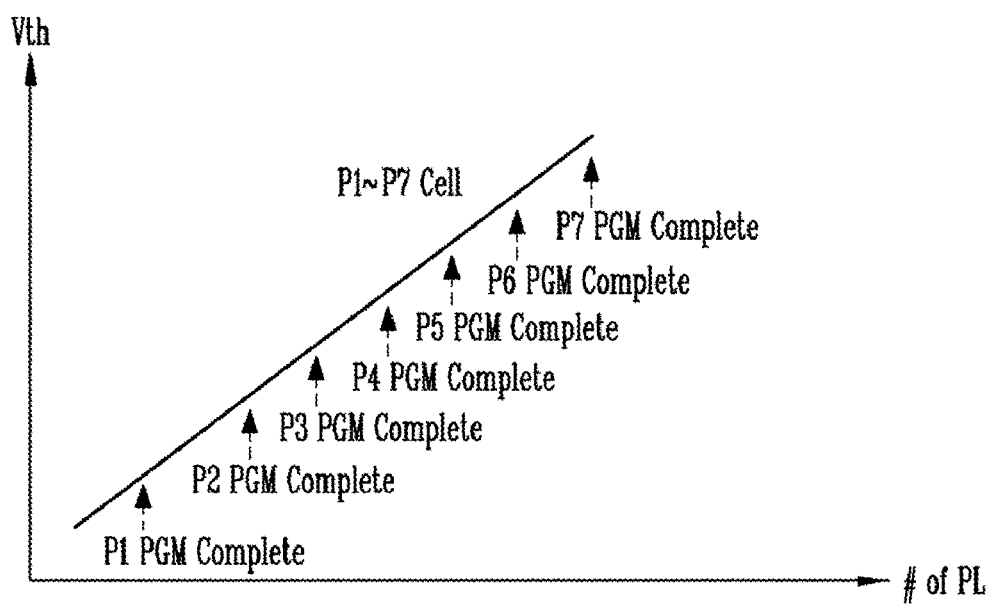
FIG. 10 is a diagram illustrating a completion time point of a program operation for each program state according to an embodiment.

FIG. 10 is a diagram illustrating a completion time point of a program operation for each program state according to an embodiment.

Referring to FIG. 10, as the program loop count increases, the program operation may be sequentially completed from a low program state to a high program state.

In FIG. 10, after the program operation on the memory cell to be programmed to the first program state P1 is completed, the program operation on the memory cell to be programmed to the second program state P2 may be completed. In a similar order, after the program operation on the memory cell to be programmed to the sixth program state P6 is completed, the program operation on the memory cell to be programmed to the seventh program state P7 may be completed.

FIG. 11 is a diagram illustrating program setting values related to the program operation of FIG. 10.

Referring to FIG. 11, the program setting table stored in the program setting table storage 131 may include setting values of operation voltages related to the program operation. In FIG. 11, the program operation may be performed during first to thirteenth program loops. However, the number of program loops performed in the program operation and the time point at which the program operation is completed for each program state are not limited to the present embodiment.

In FIG. 11, a word line voltage may increase from a start voltage VWL by a step voltage ΔVWL each time the program loop count increases.

A program permission voltage Vgnd may be applied to a bit line connected to the memory cell that is being programmed among the memory cells to be programmed to the plurality of program states P1 to P7. The program permission voltage Vgnd may be a ground voltage level. A program inhibition voltage Vinh may be applied to a bit line connected to a memory cell in which a program is completed among the memory cells to be programmed to the plurality of program states P1 to P7. The program inhibition voltage Vinh may be applied to a bit line connected to a program inhibition memory cell. The program inhibition memory cell may be the memory cell in the erase state E.

A program step voltage Vps may be a difference value between the word line step voltage ΔVWL and a bit line step voltage ΔVBL. In FIG. 11, the bit line step voltage ΔVBL may be the same as 0V in all program states.

The program operations on the memory cells to be programmed to the first to seventh program states P1 to P7 may be completed in different program loops.

For example, the program operation on the memory cell to be programmed to the first program state P1 may start in the first program loop and complete in the fourth program loop.

The program operation on the memory cell to be programmed to the second program state P2 may start in the first program loop and complete in the fifth program loop.

The program operation on the memory cell to be programmed to the third program state P3 may start in the first program loop and complete in the sixth program loop.

The program operation on the memory cell to be programmed to the fourth program state P4 may start in the first program loop and complete in the eighth program loop.

The program operation on the memory cell to be programmed to the fifth program state P5 may start in the first program loop and complete in the ninth program loop.

The program operation on the memory cell to be programmed to the sixth program state P6 may start in the first program loop and complete in the eleventh program loop.

The program operation on the memory cell to be programmed to the seventh program state P7 may start in the first program loop and complete in the thirteenth program loop.

Figure 12:
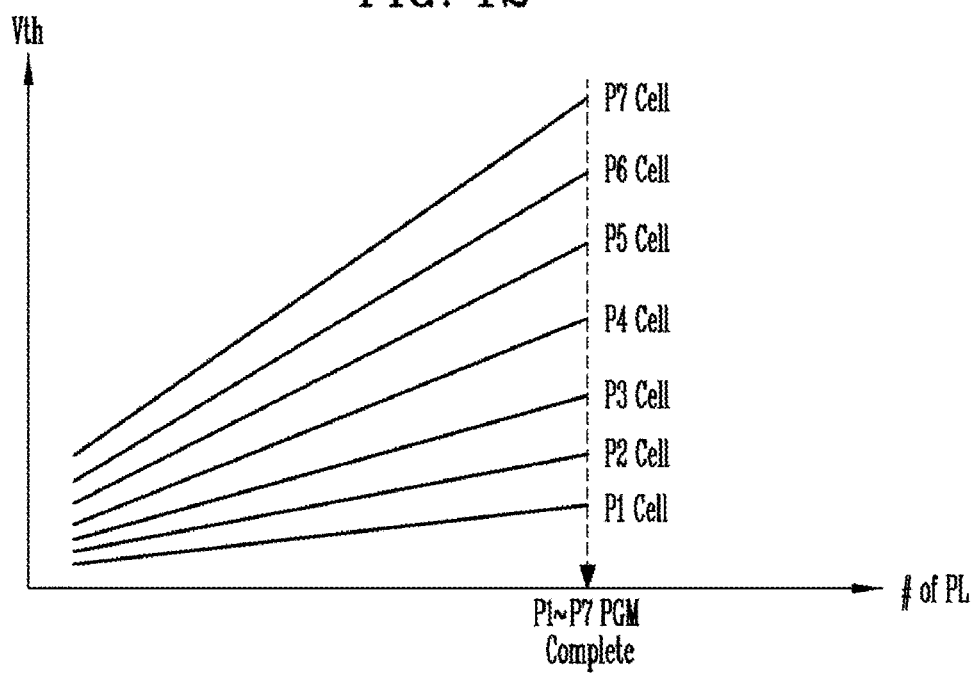
FIG. 12 is a diagram illustrating a completion time point of a program operation for each program state according to an embodiment.

FIG. 12 is a diagram illustrating a completion time point of a program operation for each program state according to an embodiment.

Referring to FIG. 12, the program operations for all program states may be simultaneously completed regardless of the program loop count.

In FIG. 12, the program operation on the memory cells to be programmed to the first to sixth program states P1 to P6 may be completed in the program loop the same as the program operation on the memory cells to be programmed to the seventh program state P7, which is the highest program state.

FIG. 13 is a diagram illustrating program setting values related to the program operation of FIG. 12.

Referring to FIG. 13, the program operation may be performed during first to eighth program loops. However, the number of program loops performed in the program operation and the time point at which the program operation is completed for each program state are not limited to the present embodiment.

In FIG. 13, the word line voltage may increase by a word line step voltage $\Delta VWL\_a$ from the word line start voltage VWL each time the program loop count increases. The bit line voltages corresponding to each of the plurality of program states may be set based on the different bit line step voltages according to the target program state. The bit line step voltage may be different for each program state.

The bit line step voltage corresponding to each of the first to sixth program states P1 to P6 may be first to sixth bit line step voltages $0VBL1\_a$ to $0VBL6\_a$. The bit line step voltage corresponding to the seventh program state P7, which is the highest program state, may be 0V, which is a ground voltage.

A magnitude of the bit line step voltage may be set to be lower as a corresponding target program state is higher. Therefore, the magnitude of the voltage may be set to be low in an order from the first bit line step voltage $0VBL1\_a$ to the sixth bit line step voltage $0VBL6\_a$.

The bit line voltage may increase from a bit line start voltage corresponding to each program state by the bit line step voltage corresponding to each program state each time the program loop count increases. The bit line start voltage and the bit line step voltage may be set differently for each program state.

For example, the bit line voltage applied to the bit line connected to the memory cell to be programmed to the first program state may increase from the bit line start voltage $VBL1\_a$ by the bit line step voltage $0VBL1\_a$ each time the program loop count increases. The bit line voltage applied to the bit line connected to the memory cell to be programmed to the second program state may increase from the bit line start voltage $VBL2\_a$ by the bit line step voltage $\Delta VBL2\_a$ each time the program loop count increases. Similarly, the bit line voltage applied to the bit line connected to the memory cell to be programmed to the sixth program state may increase from the bit line start voltage $VBL6\_a$ by the bit line step voltage $\Delta VBL6\_a$ each time the program loop count increases. The bit line voltage applied to the bit line connected to the memory cell to be programmed to the seventh program state, which is the highest program state, may be the program permission voltage Vgnd.

The program inhibition voltage Vinh_a may be applied to the bit line connected to the memory cell in which the program is completed among the memory cells to be programmed to the plurality of program states P1 to P7. The program inhibition voltage Vinh_a may be applied to the bit line connected to the program inhibition memory cell. The program inhibition memory cell may be the memory cell in the erase state E.

The program step voltage Vps may be a difference value between the word line step voltage $\Delta VWL\_a$ and the bit line step voltage $\Delta VBL$. In FIG. 13, a program step voltage $Vps1\_a$ corresponding to the first program state P1 may be a difference value between the word line step voltage $\Delta VWL\_a$ and the first bit line step voltage $\Delta VBL1\_a$. A program step voltage $Vps2\_a$ corresponding to the second program state P2 may be a difference value between the word line step voltage $\Delta VWL\_a$ and the second bit line step voltage $\Delta VBL2\_a$. In a similar method, a program step voltage $Vps6\_a$ corresponding to the sixth program state P6 may be a difference value between the word line step voltage $\Delta VWL\_a$ and the sixth bit line step voltage $\Delta VBL6\_a$.

A program step voltage $Vps7\_a$ corresponding to the seventh program state P7, which is the highest program state, may be the word line step voltage $\Delta VWL\_a$ because the seventh bit line step voltage is the ground voltage.

The program operation on the memory cells to be programmed to the first to seventh program states P1 to P7 may be completed in the same program loop.

For example, all program operations on the memory cells to be programmed to the first to seventh program states P1 to P7 may start in the first program loop and complete in the eighth program loop.

In FIG. 13, the bit line start voltage and the bit line step voltage may be set differently for each program state. Because the bit line voltage is adjusted differently for each program loop count for each program state, the program operation on all program states may be completed in the same program loop.

In an embodiment, even though the word line step voltage $\Delta VWL\_a$ of FIG. 13 is set to be greater than the word line step voltage $\Delta VWL$ of FIG. 11, the bit line voltage is adjusted differently for each program loop count for each program state, and thus the program operation may be normally performed. Because the word line step voltage $\Delta VWL\_a$ of FIG. 13 is greater than the word line step voltage $\Delta VWL$ of FIG. 11, the program operation of FIG. 13 may be completed in an earlier program loop than for the program operation of FIG. 11. The program operation of FIG. 13 may be performed faster than the program operation of FIG. 11.

Figure 14:
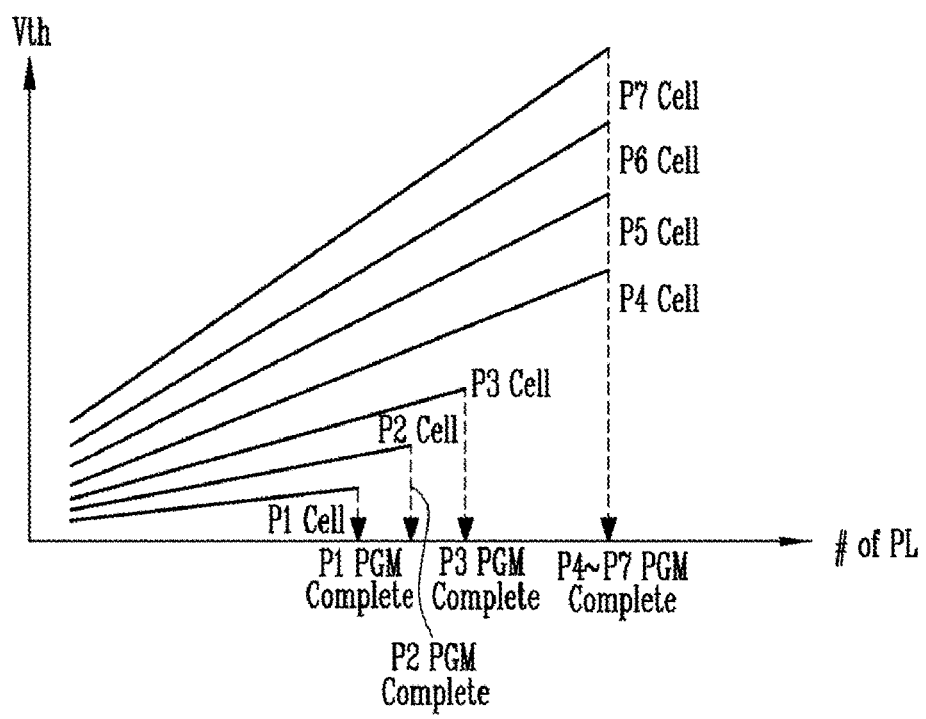
FIG. 14 is a diagram illustrating a completion time point of a program operation for each program state according to an embodiment.

FIG. 14 is a diagram illustrating a completion time point of a program operation for each program state according to an embodiment.

Referring to FIG. 14, the program operations for at least two or more of the plurality of program states may be completed in the same program loop.

After the program operation on the memory cell to be programmed to the first program state P1 is completed, the program operation on the memory cell to be programmed to the second program state P2 may be completed. After the program operation on the memory cell to be programmed to the second program state P2 is completed, the program operation on the memory cell to be programmed to the third program state P3 may be completed. After the program operation on the memory cell to be programmed to the third program state P3 is completed, the program operation on the memory cell to be programmed to the fourth to seventh program states P4 to P7 may be completed in the same program loop.

FIG. 15 is a diagram illustrating program setting values related to the program operation of FIG. 14.

Referring to FIG. 15, the program operation may be performed during first to ninth program loops.

The program operations on the memory cells to be programmed to the first to third program states P1 to P3 may be completed in different program loops. The program operation on the memory cells to be programmed to the fourth to seventh program states P4 to P7 may be completed in the same program loop.

For example, the program operation on the memory cell to be programmed to the first program state P1 may start in the first program loop and complete in the sixth program loop.

The program operation on the memory cell to be programmed in the second program state P2 may start in the first program loop and complete in the seventh program loop.

The program operation on the memory cell to be programmed to the third program state P3 may start in the first program loop and complete in the eighth program loop.

The program operation on the memory cell to be programmed to the fourth to seventh program states P4 to P7 may start in the first program loop and complete in the ninth program loop.

The program inhibition voltage Vinh_b may be applied to the bit line connected to the memory cell in which the program is completed among the memory cells to be programmed to the plurality of program states P1 to P7. The program inhibition voltage Vinh_b may be applied to the bit line connected to the program inhibition memory cell. The program inhibition memory cell may be the memory cell in the erase state E.

As compared with FIG. 13, the word line step voltage $\Delta VWL\_b$ may be set to be less than the word line step voltage $\Delta VWL\_a$. The bit line start voltage VBL_b may be set to be less than the bit line start voltage VBL_a. The bit line step voltage $\Delta VBL\_b$ may be set to be less than the bit line step voltage $\Delta VBL\_a$.

Because the word line step voltage $\Delta VWL\_b$ is less than the word line step voltage $\Delta VWL\_a$, the program operation of FIG. 15 is performed during later program loops than for the program operation of FIG. 13. However, because the program inhibition voltage Vinh_b, which is a maximum voltage value applied to the bit line, is set to be lower than the program inhibition voltage Vinh_a, an interference effect between the bit lines may be reduced.

FIG. 16 is a flowchart illustrating a program operation of a memory device according to an embodiment.

Referring to FIG. 16, in step S1601, the memory device may set the bit line voltages corresponding to the target program state based on the different bit line step voltages, according to the target program state of each of the plurality of memory cells among the plurality of program states.

In step S1603, the memory device may apply the set bit line voltages to the bit lines connected to the plurality of memory cells.

In step S1605, the memory device may apply the program voltage to the word line connected to the selected memory cells among the plurality of memory cells.

The memory device may perform the program operation using the bit line voltages set based on the different bit line step voltages for each program state through steps S1601 to S1605. The program operation may be performed in fewer program loops by adjusting the bit line voltages differently for each program state and each program loop count. That is, the program operation may be completed in a shorter time.

What is claimed is:

1. A memory device comprising:
   a plurality of memory cells;
   a peripheral circuit configured to perform an incremental step pulse program (ISPP) on a selected memory cell among the plurality of memory cells to a target program state among a plurality of program states; and
   control logic configured to store a program setting table on bit line step voltages corresponding to the plurality of program states, respectively, and control the peripheral circuit to perform the ISPP using a bit line voltage set based on the target program state and the program setting table,
   wherein the bit line step voltages have different values from each other according to corresponding program states, respectively, in the program setting table.

2. The memory device of claim 1, wherein the control logic comprises:
   a program setting table storage configured to store the program setting table including information on the bit line step voltages; and
   a program operation controller configured to control the peripheral circuit to perform the ISPP based on the information on the bit line step voltages.

3. The memory device of claim 2,
   wherein the program setting table storage updates the information on the bit line step voltages according to a request of a host or a lifetime of the memory device.

4. The memory device of claim 3,
   wherein as the target program state is higher, a magnitude of a bit line step voltage corresponding to the target program state is set to be lower.

5. The memory device of claim 4,
   wherein as the target program state is higher, a magnitude of a program step voltage corresponding to the target program state is set to be higher.

6. The memory device of claim 5,
   wherein the magnitude of the program step voltage corresponding to the target program state is a difference value between a word line step voltage and the bit line step voltage corresponding to the target program state.

7. The memory device of claim 3,
wherein the program operation controller controls the peripheral circuit to increase the bit line voltage by a corresponding bit line step voltage as a program loop count increases.

8. The memory device of claim 3,
wherein the program operation controller completes program operations for at least two or more of the plurality of program states in the same program loop.

9. The memory device of claim 3,
wherein the program operation controller completes program operations for each of the plurality of program states in a last program loop.

10. The memory device of claim 1,
wherein a bit line voltage corresponding to a highest program state among the plurality of program states is set to a ground voltage level.

11. A method of operating a memory device that performs an incremental step pulse program (ISPP) on a selected memory cell among a plurality of memory cells to a target program state among a plurality of program states, the method comprising:
setting a bit line voltage based on the target program state and a program setting table on bit line step voltages corresponding to the plurality of program states, respectively;
applying the set bit line voltage to a bit line connected to the selected memory cell; and
applying a program voltage to a word line connected to the selected memory cell among the plurality of memory cells,
wherein the bit line step voltages have different values from each other according to corresponding program states, respectively, in the program setting table.

12. The method of claim 11,
wherein the setting the bit line voltage comprises increasing the bit line voltage by a corresponding bit line step voltage as a program loop count increases.

13. The method of claim 12,
wherein the increasing the bit line voltage comprises setting a bit line voltage corresponding to a highest program state among the plurality of program states to a ground voltage level.

14. The method of claim 11, further comprising, in the ISPP, completing program operations for at least two or more of the plurality of program states in the same program loop.

15. The method of claim 11, further comprising, in the ISPP, completing program operations for each of the plurality of program states in a last program loop.

16. The method of claim 11, further comprising setting a magnitude of a bit line step voltage corresponding to the target program state to be lower as the target program state is higher.

17. The method of claim 16, further comprising setting a magnitude of a program step voltage corresponding to the target program state to be higher as the target program state is higher.

18. The method of claim 17,
wherein the magnitude of the program step voltage corresponding to the target program state is a difference value between a word line step voltage and the bit line step voltage corresponding to the target program state.

19. The method of claim 11, further comprising:
updating the program setting table on the bit line step voltages according to a request of a host or a lifetime of the memory device.

20. The method of claim 11, further comprising completing a program operation on at least one of the plurality of program states in different program loops according to the target program state.

* * * * *